(12) United States Patent
Basol et al.

(10) Patent No.: US 8,318,239 B2
(45) Date of Patent: Nov. 27, 2012

(54) METHOD AND APPARATUS FOR DETECTING AND PASSIVATING DEFECTS IN THIN FILM SOLAR CELLS

(75) Inventors: Bulent M. Basol, Manhattan Beach, CA (US); David Soltz, San Jose, CA (US)

(73) Assignee: SoloPower, Inc., San Jose, CA (US)

( * ) Notice: Subject to any disclaimer, the term of this patent is extended or adjusted under 35 U.S.C. 154(b) by 793 days.

(21) Appl. No.: 12/272,499

(22) Filed: Nov. 17, 2008

(65) Prior Publication Data

US 2010/0124600 A1     May 20, 2010

(51) Int. Cl.
*B05D 5/06* (2006.01)
(52) U.S. Cl. .......................................... 427/74
(58) Field of Classification Search ............ 427/74
See application file for complete search history.

(56) References Cited

U.S. PATENT DOCUMENTS

| | | | |
|---|---|---|---|
| 4,640,002 A * | 2/1987 | Phillips et al. ............ | 438/12 |
| 4,729,970 A | 3/1988 | Nath et al. | |
| 4,862,000 A | 8/1989 | Kubota et al. | |
| 5,334,844 A * | 8/1994 | Pollard et al. ............ | 250/330 |
| 5,356,656 A * | 10/1994 | Kuo et al. ................ | 438/96 |
| 5,677,204 A | 10/1997 | Imai et al. | |
| 6,132,585 A * | 10/2000 | Midorikawa et al. ..... | 205/123 |
| 6,225,640 B1 * | 5/2001 | Glenn et al. ............. | 250/559.45 |
| 6,979,391 B1 | 12/2005 | Hubel | |
| 2002/0113298 A1 * | 8/2002 | Tsuji ....................... | 257/666 |
| 2007/0295394 A1 * | 12/2007 | Lee ......................... | 136/252 |
| 2008/0093221 A1 | 4/2008 | Basol | |

FOREIGN PATENT DOCUMENTS

EP   1163552   3/2007

OTHER PUBLICATIONS

International Search Report issued Jan. 20, 2010 in PCT/US09/64604.

* cited by examiner

*Primary Examiner* — Michael Cleveland
*Assistant Examiner* — Robert Vetere
(74) *Attorney, Agent, or Firm* — Pillsbury Winthrop Shaw Pittman LLP

(57) ABSTRACT

The embodiments of the present invention provide a defect detection process and apparatus to detect defects in solar cell structures. During the process, an input signal from a signal source is applied to a top surface of a transparent conductive layer of a solar cell structure. In response to the input signal, an output signal is generated from a predetermined area of the top surface and detected by a defect detector. The output signal carrying the defect position information is transmitted to a computer and registered in a database. With the position information, an injector is driven to the defect location to apply an insulator to passivate the defect. A finger pattern layer may be formed over the predetermined area after completing the defect detection and passivation processes.

23 Claims, 7 Drawing Sheets

METHOD AND APPARATUS FOR DETECTING AND PASSIVATING DEFECTS IN THIN FILM SOLAR CELLS

BACKGROUND

1. Field of the Inventions

The present inventions relate to method and apparatus for detecting and passivating defects in a thin film solar cell stricture, specifically in a Group IBIIIAVIA compound thin film solar cell structure.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS-type, or CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded high conversion efficiencies. Specifically, $Cu(In,Ga)Se_2$ or CIGS absorbers have been used to demonstrate 19.9% efficient solar cells. In summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated over a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown on a conductive layer 13 or contact layer, which is previously deposited on the substrate 11 and which acts as the electrical contact to the device. The substrate 11 and the conductive layer 13 form a base 13A on which the absorber film 12 is formed. Various conductive layers comprising Mo, Ta, W, Ti, and stainless steel etc. have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO or CdS/ZnO etc. stack is formed on the absorber film. Radiation 15 enters the device through the transparent layer 14. The transparent layer 14 is sometimes referred to as the window layer. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

The conversion efficiency of a thin film solar cell depends on many fundamental factors, such as the bandgap value and electronic and optical quality of the absorber layer, the quality of the window layer, the quality of the rectifying junction, etc. A common practical problem associated with manufacturing thin film devices, however, is the inadvertent introduction of defects into the device structure. Since the total thickness of the electrically active layers of thin film solar cells is in the range of 0.5-5 micrometers, these devices are highly sensitive to defectivity. Even the micron size defects may influence their illuminated I-V characteristics. There may be different types of defects in thin film solar cell structures. Some of these defects may be only morphological in nature and they may be "nuisance defects", which are not electrically active. Other defects, on the other hand, may be electrically active and may negatively impact the performance of the device. Such defects are sometimes called "killer defects". Shunting defects, for example, may introduce a shunting path through which the electrical current of the device may leak through and therefore they may be considered to be "killer defects". Such shunting defects lower the fill factor, the voltage and the conversion efficiency of the solar cells, and therefore, they need to be minimized, eliminated or passivated. Detection and passivation of harmful defects improve the yield of thin film solar cell processing and therefore may be critical for low cost, high efficiency thin film solar cell manufacturing.

Prior work in eliminating shunting defects in solar cells includes work by Nostrand et al. (U.S. Pat. No. 4,166,918) who used an approach to bias the cell and heat up the shunts that carry a high current. A cermet material was incorporated into the cell stack which preferentially formed insulators at the shunt positions during the bias due to local heating. Izu et al. (U.S. Pat. No. 4,451,970) scanned the surface of the solar cell with a contacting liquid bead which electrochemically etched or anodized the shorting regions. The etched regions could then be filled with a dielectric. This technique may be applicable for the amorphous Si type solar cells. However, etching or anodizing of CIGS type compound materials leave behind conductive residues comprising metallic species of Cu, In or Ga at the etched location that actually may make shorting even worse than before etching. Phillips et al. (U.S. Pat. No. 4,640,002) used Laser Beam Induced Current (LBIC) technique to locate shorting defects on solar cell structures and then burned the shorts out by using a high power laser beam. A similar approach is recently used in US Patent Application 2007/0227586. Hjalmar et al. (U.S. Pat. No. 6,750,662) scanned the surface of Si solar cells with a voltage point probe and applied a voltage or light bias (illumination) detecting areas with shunts. This approach may work for thick crystalline solar cells, but would damage thin film devices. Glenn et al. (U.S. Pat. No. 6,225,640) used electroluminescence imaging on completed solar cells and removed detected defects chemically. Again such an approach is not applicable to flexible thin film devices such as CIGS cells, because as will be discussed later, defects in such thin film structures need to be detected and fixed before the solar cell is actually completed. Zapalac (US Patent Publication 2007/0227586) used laser scanning, spectroscopic ellipsometry and photoluminescence to determine shunts on finished solar cells and described ways of shunt removal by ablation or scribing.

As the brief review above shows, importance of detection and removal of shunt defects in solar cells has been recognized for many years. Much of the work has concentrated on standard Si solar cells and techniques have been developed to detect shunts in finished devices. In thin film structures using CdTe, polycrystalline Si, amorphous Si, and CIGS absorber layers, the nature and chemical composition of the layers within the device structure are widely different, changing from a single element (Si), to more complex compounds such as a binary compound (CdTe), a ternary compound (CIS), a quaternary compound (CIGS), and a pentenary compound (CIGSS). Therefore, one defect removal method which may work for one device may not work for the other. The laser ablation method that is used for shunt removal, for example, is very successful for Si devices because Si can be easily ablated without leaving behind debris that would affect device performance. For CdTe, process window for laser ablation is narrow because there is the possibility of formation of conductive debris comprising metallic Cd and/or Te at the location where laser ablation is performed. For CIGS, there is to date no successful laser ablation process because laser heating of this compound leaves behind conductive phases comprising Cu, In, Ga metals and/or Cu—Se phases. Such conductive phases introduce further shunts in the device structure at the laser ablated locations. Similarly, techniques using chemical etching of defect areas introduce problems for devices employing compound semiconductors such as CdTe and CIGS(S). In such compounds, chemical etching does not etch the material uniformly and leaves behind conductive residue. Therefore, there is a need to develop defect detection and passivation approaches that are specifically suited for CIGS-type thin film device structures manufactured in a roll-to-roll manner.

SUMMARY

The present inventions relate to method and apparatus for detecting and passivating defects in a thin film solar cell structure, specifically in a Group IBIIIAVIA compound thin film solar cell structure.

In one embodiment there is provided a method of manufacturing a solar cell, comprising providing a continuous flexible solar cell structure, wherein continuous flexible solar cell structure includes a back portion having a substrate and a contact layer and a front portion having a absorber layer and a transparent conductive layer; advancing a section of the continuous flexible solar cell structure over a flat surface of a platform; determining a process area on the front portion, the process area being less than 20% of the section of the continuous flexible solar cell structure; applying an input signal to the process area; sensing an output signal from the process area by a detector; processing the output signal sensed by the detector to detect a defect in the front portion in the process area; passivating the defect by applying an insulator onto the defect; and depositing a conductive grid pattern only within the process area.

In different embodiments, different types of input signals can be input and corresponding output signals can be detected for example, the input signal can induce one of infra-red (IR) radiation, photoluminescence and electroluminescence as the output signal.

DETAILED DESCRIPTION

The embodiments of the present invention provides a defect detection process and apparatus to detect defects in solar cell structures. In one embodiment a roll to roll defect detection apparatus may be used to detect and passivate the defects formed within a flexible continuous workpiece including a stack of a base, a CIGS absorber formed on the base and a transparent conductive layer formed on the CIGS absorber layer. During the process, initially a section of the continuous flexible workpiece is made substantially flat and an input signal from a signal source is applied to a front surface of the section. The front surface may be the top surface of the transparent conductive layer or a surface of a temporary layer coated on the transparent conductive layer. In response to the input signal, an output signal is generated from a predetermined area of the front surface and detected by a defect detector. The output signal carrying the defect position information is transmitted to a computer and registered in a database. With the position information, an injector device is driven to the defect location to apply an insulator material, preferably an insulating ink, to passivate the defect. If the surface has the temporary layer, the passivation process is performed after removing the temporary layer. A grid pattern layer may be formed over the predetermined area after completing the defect detection and passivation processes.

Figure 1:
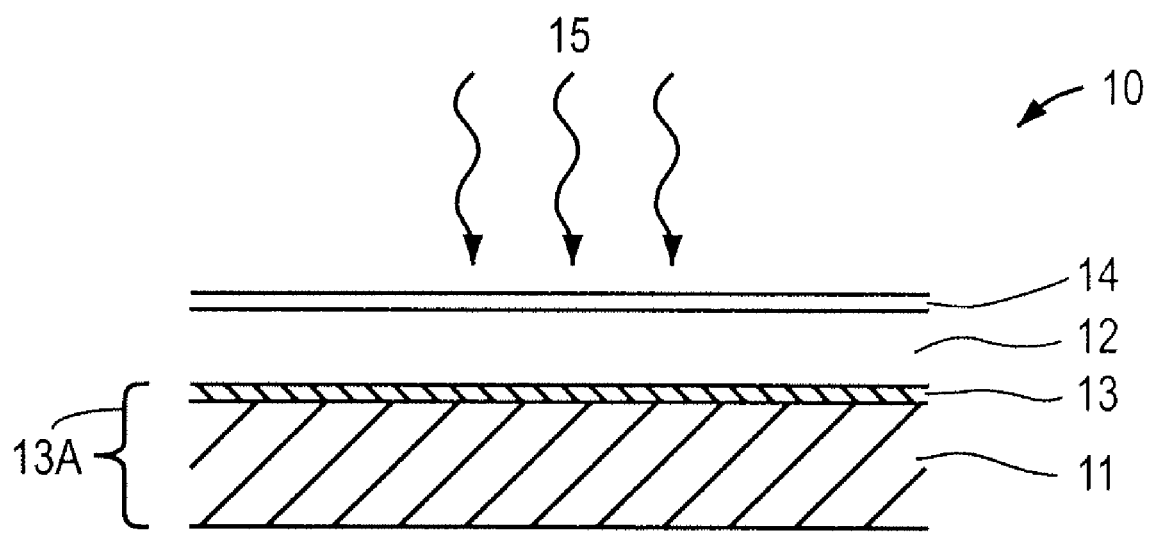
FIG. 1 is a cross-sectional view of an exemplary thin film solar cell employing a Group IBIIIAVIA absorber layer.
Figure 2:
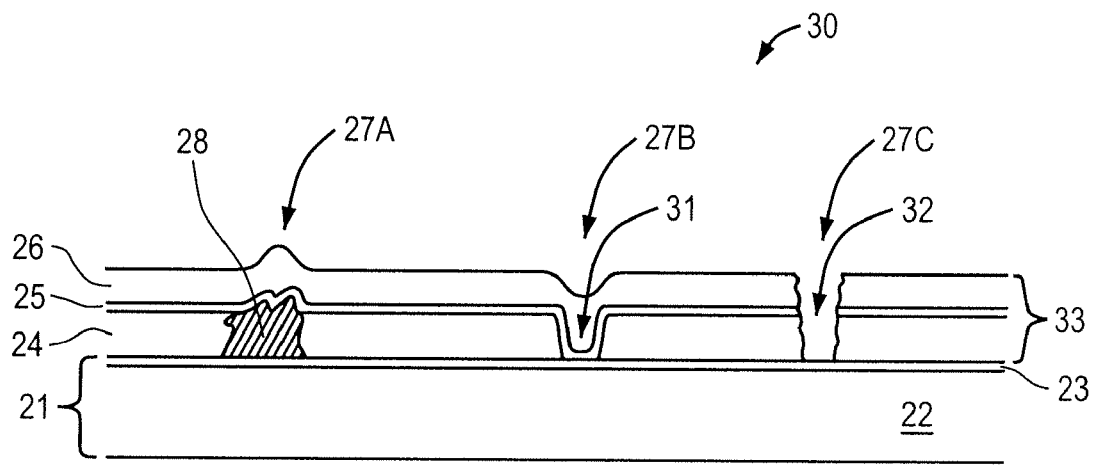
FIG. 2 shows a section of a solar cell structure with three different exemplary types of defects.

Certain aspects of the embodiments will now be described using a solar cell structure 30 shown in FIG. 2. FIG. 2 shows a cross sectional view of an exemplary section of a solar cell structure 30 with three different exemplary defect regions, 27A, 27B and 27C. The solar cell structure 30, which may be a CIGS thin film solar cell structure, comprises a base 21 which includes a substrate 22 and a contact layer 23. An absorber layer 24 or CIGS layer is formed on the contact layer 23. It should be noted that the solar cell structure 30 is only exemplary and the embodiments may be applied to many other thin film solar cell structures utilizing other solar cell absorber layers. A buffer layer 25 such as a CdS layer and a transparent conductive film 26 such as a transparent conductive oxide (TCO) film are then deposited over the CIGS layer 24. The TCO film 26 may be a ZnO film, an indium tin oxide (ITO) film, or a TCO stack film, such as an "undoped ZnO/doped ZnO" stack film or a ZnO/ITO stack film, etc.

As shown in FIG. 2, a conductive particle 28 over the contact layer 23 causes the defect region 27A to form. The conductive particle may be introduced during or before the deposition of the CIGS layer 24. Alternately, the conductive particle 28 may be introduced during the deposition of the contact layer 23, and therefore, it may be in or under the contact layer 23. Regardless of how it may be introduced, the conductive particle 28 establishes a conductive path between the TCO film 26 and the contact layer 23. Presence of the buffer layer 25 in this conductive path may increase its resistance. However, since the thickness of the buffer layer 25 is typically less than 100 nm, it is generally not adequate to fully eliminate the conductive path between the TCO film 26 and the contact layer 23 in the defect region 27A. Defect region 27B in FIG. 2 may be formed by the presence of a pinhole 31 in the CIGS layer 24. The pinhole 31 may be formed during or after the deposition of the CIGS layer 24 and the cavity formed by the pinhole 31 may be filled by the buffer layer 25 and the TCO film 26 during subsequent process steps. Alternately the pinhole 31 may form during or after the deposition of the buffer layer 25, in which case, its cavity would be filled only by the TCO film 26. In any case, as can be seen from FIG. 2, the pinhole 31 filled by the TCO film 26 introduces a conductive path between the TCO film 26 and the contact layer 23. Presence of the buffer layer 25 in this conductive path may increase its resistance. However, since the thickness of the buffer layer 25 is typically less than 100 nm, it usually is not adequate to fully eliminate the conductive path between the TCO film 26 and the contact layer 23 in the defect region 27B. Defect region 27C in FIG. 2 may be formed by the presence of a void 32 in the "CIGS layer/buffer layer/TCO film" stack 33. The void 32 may be formed during or after the formation of the TCO film 26. The void 32 may not be filled by any conductive material, and therefore, there may not be a conductive path between the TCO film 26 and the contact layer 23 through the void 32 at the defect region 27C. In this respect, the defect region 27C may be considered a "nuisance defect" region. However, this situation may change when a finger pattern or grid pattern is deposited over the TCO film 26, as will be described next.

Figure 3:
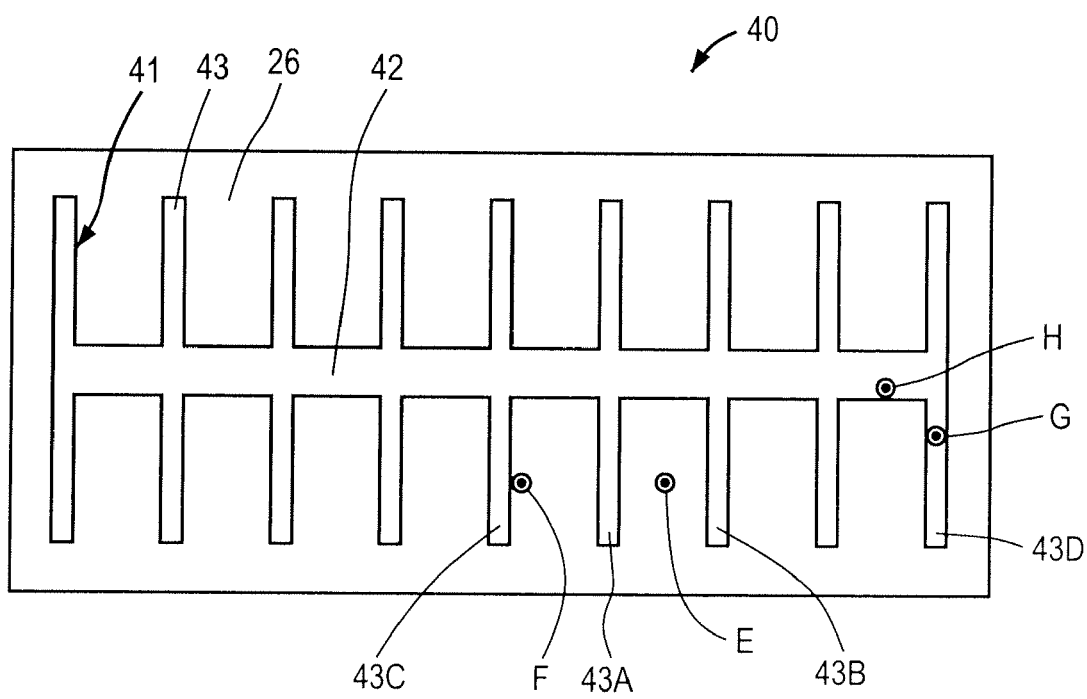
FIG. 3 shows a top view of a thin film solar cell with a grid pattern.

FIG. 3 shows a top view of an exemplary CIGS solar cell 40. The CIGS solar cell 40 may be obtained by depositing a grid pattern 41 on the TCO film 26 of the solar cell structure 30 depicted in FIG. 2. The grid pattern 41 typically comprises one or more, 1-4 mm wide busbars 42, which are the main carriers or conduits of the light generated and collected current of the device, and multiple narrow fingers 43, which may be 50-200 micrometers wide and distributed in specially designed patterns on the top surface of the TCO film 26 to collect the light generated current with minimal electrical loss and to deliver it to the busbars 42. As is well known in the field, the grid pattern 41 is designed to maximize the amount of light shining on the TCO film 26 (i.e. to minimize the shadow loss) and at the same time to minimize the overall series resistance of the solar cell 40. Finger patterns or grid patterns comprise highly conductive metals such as Ag, Ni, Cu, etc., and are deposited by techniques such as evaporation, electroplating, ink jet writing and screen printing. Ink jet writing and screen printing approaches usually employ Ag-particle based inks or pastes that are deposited on the surface of the TCO film 26 in the form of the grid pattern 41. In any case, the busbars 42 and fingers 43 are designed to be highly conductive since their purpose is to lower the series resistance of the device and transmit the current with minimal "I.R" loss. Materials employed in the structure of the grid pattern 41 have bulk resistivity values in the order of $10^{-5}$-$10^{-6}$ ohm-cm. The sheet resistance of the fingers 43 and the busbars 42 may be typically less than 0.01 ohms/square. The typical sheet resistance of the TCO film 26, on the other hand, may be in the range of 10-100 ohms/square, which is at least 1000 times larger than the sheet resistance of the grid pattern 41.

The exemplary defect regions 27A, 27B and 27C of FIG. 2 may further influence the completed device performance once the grid pattern 41 including a busbar 42 and fingers 43 is deposited on the TCO film 26 to form the solar cell 40 shown in FIG. 3. This may be shown using four exemplary locations on the solar cell 40, which are labeled as location E, location F, location G and location H.

If the exemplary defect region 27A described above was located at the location E, although it is away from the busbar 42 and between the two fingers 43A and 43B, the solar cell performance could be affected. As explained before, there is a conductive path between the TCO film 26 and the contact layer 23 at the defect region 27A. However, this shunting path can affect a small area of the solar cell 40 in the near vicinity of the location E. This is because the sheet resistance of the TCO film 26 is relatively high and the current collected by the TCO layer 26 between the finger 43A and finger 43B mostly chooses to flow towards these two fingers and the busbar 42, which have much lower resistance than the TCO film 26. Therefore, the defect region 27A at the location E may affect the solar cell performance, but it does not totally short circuit the device.

If the defect region 27A was at the exemplary location F which is next to finger 43C, its influence on the cell performance would be worse compared to the case discussed above, because the resistance between the finger 43C and the defect region 27A is much smaller due to the shorter distance between them. If the defect region 27A was at the location G or the location H, which are under the finger 43D and the busbar 42, respectively, it would greatly influence the performance of the solar cell 40. In this case, the very low resistance finger 43D and busbar 42 are directly over the defect region 27A, and thus the current collected by the finger 43D and the busbar 42 has a direct low resistance path to the contact layer 23. This is shunting and it is expected to reduce the fill factor, voltage and the conversion efficiency of the solar cell 40 greatly.

If the defect region 27B described above is at the exemplary location E, which is away from the busbar 42 and between the two fingers 43A and 43B, it may affect the solar cell performance. As explained before, there is a conductive path between the TCO film 26 and the contact layer 23 at the defect region 27B. However, this shunting path can affect only a small area of the solar cell 40 in the near vicinity of the location E. This is because the sheet resistance of the TCO film 26 is relatively high and the current collected by the TCO layer 26 between the finger 43A and finger 43B chooses to flow towards these two fingers and the busbar 42 which have much lower resistance than the TCO film 26. Therefore, the defect region 27B at the location E may affect solar cell performance, but it does not totally short circuit the device. If the defect region 27B was at the location F, which is next to the finger 43C, its influence on the cell performance could be worse compared to the case just discussed, because the resistance between the finger 43C and the defect region 27B is much smaller due to the shorter distance between them. If the defect region 27B was at the location G or the location H, which are under the finger 43D and the busbar 42, respectively, it would greatly influence the performance of the solar cell 40. In this case, the very low resistance finger 43D and busbar 42 are directly over the defect region 27B, and thus the current collected by the finger 43D and the busbar 42 has a direct low resistance path to the contact layer 23. This is shunting and it is expected to reduce the fill factor, voltage and the conversion efficiency of the solar cell 40.

The defect region 27C described above may be at the location E, which is away from the busbar 42 and between the two fingers 43A and 43B. In this case, as explained before, there is not a conductive path between the TCO film 26 and the contact layer 23 at the defect region 27C. Therefore, the void 32 at the defect region 27C does not generate photocurrent, but it does not introduce any shunting either. Since the size of the void 32 is typically much smaller than the total area of the solar cell 40, the loss of photocurrent is usually insignificant. For example, for a 100 cm$^2$ area solar cell, a 100 micrometer diameter void introduces only 0.00008% reduction in the generated photocurrent and it does not introduce any shunt at the location E. The situation does not change even if the defect region 27C was at the location F which is next to the finger 43C, i.e. the void 32 at the defect region 27C does not generate photocurrent, but it does not introduce any shunting either. If the defect region 27C was at the location G or at the location H, which are under the finger 43D and the busbar 42, respectively, the situation changes drastically. In this case the defect region 27C may greatly influence the performance of the solar cell 40. Specifically, as the busbar 42 and the finger 43D are deposited over the TCO film 26, the conductive materials such as Ag-filled inks or pastes constituting the grid pattern material, flow into the void 32 and establish a highly conductive shorting path between the grid pattern 41 and the contact layer 23 at the locations G and H. Thus the current collected by the grid pattern 41 find a direct low resistance path to the contact layer 23. This is shunting and it is expected to reduce the fill factor, voltage and the conversion efficiency of the solar cell 40.

As the discussion above indicates, unlike in thick Si solar cells, defects in a thin film solar cell structure negatively impact the solar cell performance, especially when any section of a grid pattern is formed on such defects. Therefore, detection and passivation of such defects in the solar cell structure are needed. Such detection and passivation preferably need to be carried out before the grid pattern is deposited or formed over the cell structure, i.e. before the solar cell is fully fabricated.

In an embodiment of the present invention, a solar cell structure is first fabricated without a grid pattern. Before the grid pattern is formed on the cell structure, a defect detection process is carried out. This process identifies the locations of the defects in the solar cell structure which may or may not be shunts, but would create shunts after finger pattern deposition. A defect passivation process may then be carried out to passivate at least some of the defects that are detected. A grid pattern is then formed on the window layer.

Figure 4:
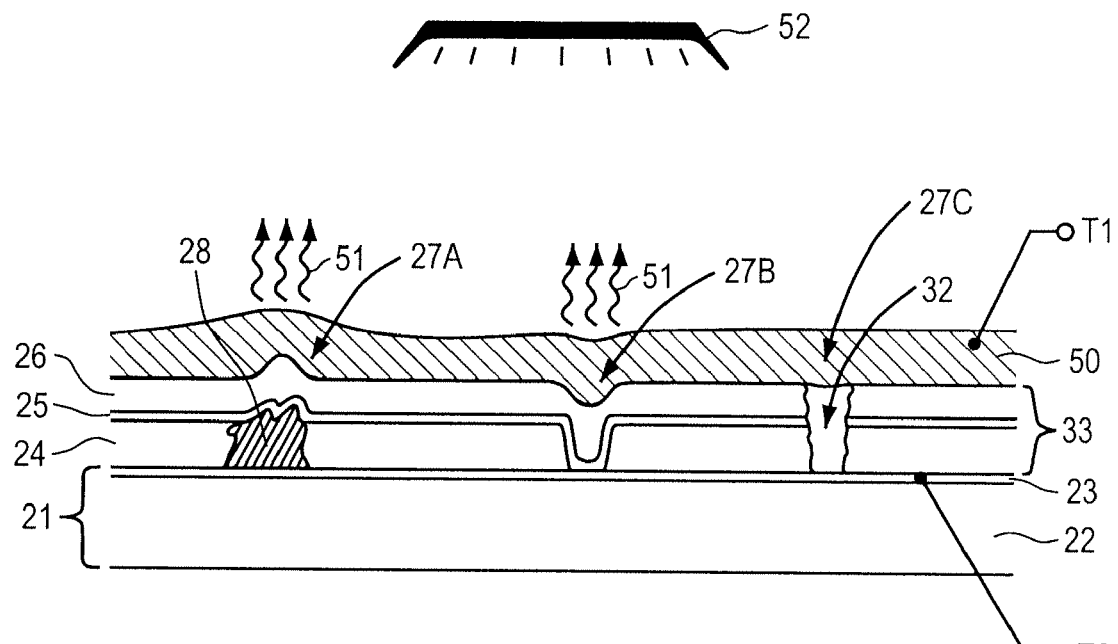
FIG. 4 shows a method of detecting defects in thin film solar cells.

FIG. 4 shows a method and apparatus to detect at least some of the defect regions that were discussed with reference to FIG. 2. As can be seen from FIG. 4, a temporary conductive blanket 50 is formed over the solar cell structure 20 of FIG. 2. In FIG. 4, the exemplary temporary conductive blanket 50 is a conductive and flexible foil such as a 10-75 micrometer thick metal foil that establishes good physical and electrical contact with the top surface of the TCO film 26. A first terminal T1 is attached to the temporary conductive blanket 50 and a second terminal T2 is attached to the contact layer 23. If the substrate 22 is a conductive foil, the second terminal T2 may be attached to the substrate 22 instead of the contact layer 23. Next, a voltage bias is applied between the first terminal T1 and the second terminal T2. It is preferable that this applied voltage biases the solar cell structure 20 in a voltage range that does not allow appreciable current passing through the device. In other words, the voltage applied either reverse biases the device or if it forward biases it, it applies a voltage that is smaller than the turn-on voltage of the diode. Since there are conductive paths between the TCO film 26 and the contact layer 23 at the defect region 27A and the defect region 27B, however, a shunt current passes between the temporary conductive blanket 50 and the contact layer 23 through the defect regions 27A and 27B. The shunt current heats up the portions of the temporary conductive blanket 50, right over the defect regions 27A and 27B. A strategically located IR camera 52 detects the IR radiation 51 emanating from these heated defect regions. In a particular embodiment, the applied bias can be modulated and the images from the IR camera processed in such a way as to "lock-in" on the modulated signal from the shunt. This technique may yield improved shunt detection. In another embodiment, the transparent conductive blanket can be replaced with a rolling contact, or pair of rolling contacts that stretch across the width of the cell. Conductive brushes may also be utilized as a substitute for the roller. As the moving temporary contact passes over or near the shorting defect region, the region gets heated and the IR camera detects the heated defect region.

The information about the location of the shunt defects may be saved by a computer and this location information may later be used to passivate the defective regions after the temporary conductive blanket 50 is removed from the top surface of the TCO film 26. It should be noted that the exemplary temporary conductive blanket 50 of FIG. 4 is a flexible foil and it may not fill the void 32 of the defect region 27C, and therefore cannot establish an electrical short circuit with the contact layer 23 through the void 32. Consequently, no shunting current passes through the defect region 27C upon application of a voltage between the terminals T1 and T2. As a result, this defect region may go undetected. To be able to detect defects such as the one at defect region 27C, it is preferable to use a temporary conductive blanket which may be in the form of a liquid or gel. This way the material of the conductive blanket would go into the void 32 and establish a short circuit between the conductive blanket and the contact layer 23. When shorting current passes through, it would heat the defect region 27C and the IR camera, operating either in DC or AC "lock-in" mode, depending on the type of bias utilized (DC or AC) could detect this heating.

Figure 5:
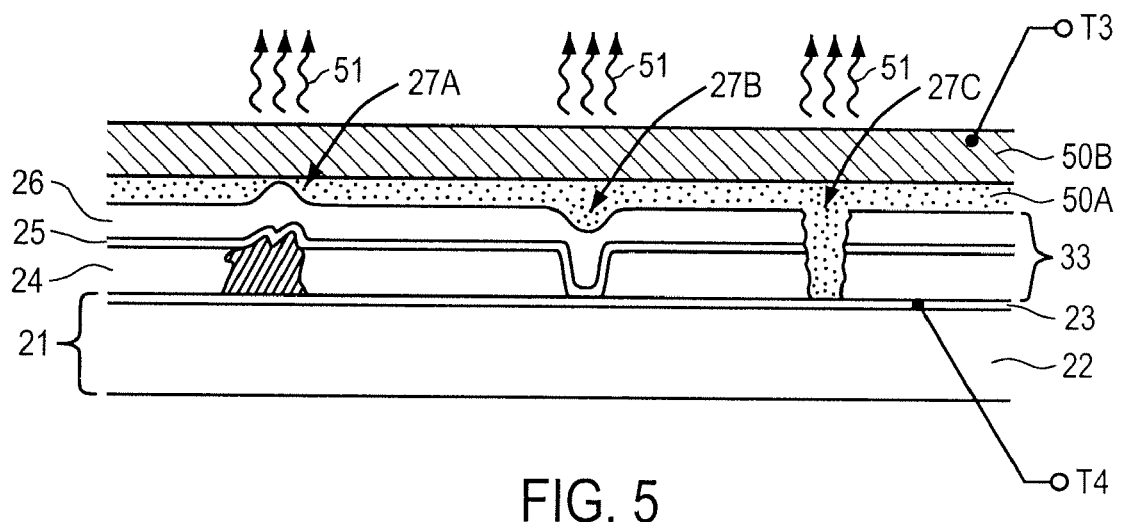
FIG. 5 is shows another method of detecting defects in thin film solar cells.

It is also possible to use a combination of different types of temporary conductive blankets. In FIG. 5, for example, a temporary conductive liquid blanket 50A is used in conjunction with a temporary conductive solid blanket 50B. The temporary conductive liquid blanket 50A may be an ionic liquid, a salt solution, etc., which has enough conductivity to allow a shunt current to pass through it but is inert and does not etch or anodize any of the solar cell layers (23, 24, 25, 26). The temporary conductive solid blanket 50B may be a thin (10-50 micrometers) metallic foil. A terminal T3 may be attached to the temporary conductive solid blanket 50B and a terminal T4 may be attached to the contact layer 23. If the substrate 22 is a conductive foil, the terminal T4 may be attached to the substrate 22 instead of the contact layer 23. Next, a voltage bias is applied between the terminal T3 and the terminal T4. It is preferable that this applied voltage biases the solar cell structure 20 in a voltage range that does not allow appreciable current passing through the device itself. However, since there are conductive paths between the TCO film 26 and the contact layer 23 at the defect regions 27A, 27B, and 27C, a shunt current passes between the temporary conductive solid blanket 50B and the contact layer 23, through the temporary conductive liquid blanket 50A and the defect regions 27A, 27B and 27C. The shunt current heats up the portions of the temporary conductive solid blanket 50B, right over the defect regions 27A, 27B and 27C. A strategically located IR camera (not shown) detects the IR radiation 51 emanating from all three defect regions. Operation in AC or "lock-in" mode may allow for the use of lower bias to achieve the same signal level for defect detection, reducing collateral damage to the cell. The information about the location of the shunt defects may be saved by a computer and this location information may later be used to passivate the defective regions after the temporary conductive solid blanket 50B and the temporary conductive liquid blanket 50A are removed from the top surface of the TCO film 26.

Figure 6:
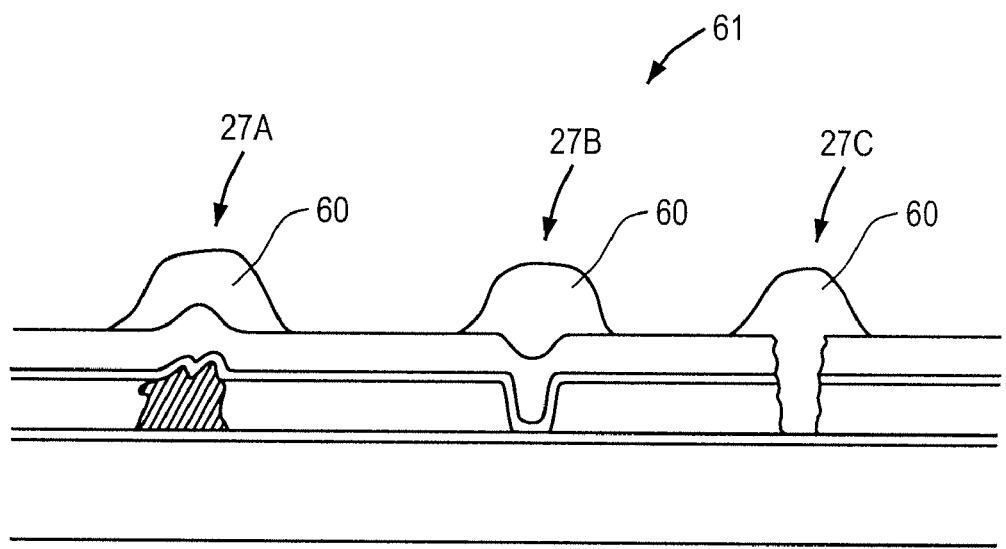
FIG. 6 shows the defects shown in FIG. 2, wherein the defects have been passivated.

After collecting the defect location information, passivation of the defect regions 27A, 27B and 27C may be achieved by forming high resistance caps 60 over them as shown in FIG. 6. The high resistance caps 60 may be applied by various ways including by small injectors or ink jet heads that may travel to the already determined position of the defect and dispense a small amount of a high resistivity material. The high resistivity material may be in the form of an ink which may be later cured by heat or radiation. Ultra violet curable insulating inks are well suited for this application since they can cure quickly within a few seconds. It should be appreciated that, formation of a grid pattern (not shown) on the defect-passivated solar cell structure 61 of FIG. 6 would not cause shorting or shunting even if the busbars or fingers of the grid pattern directly land on any of the passivated defect areas 27A, 27B and 27C.

Figure 7:
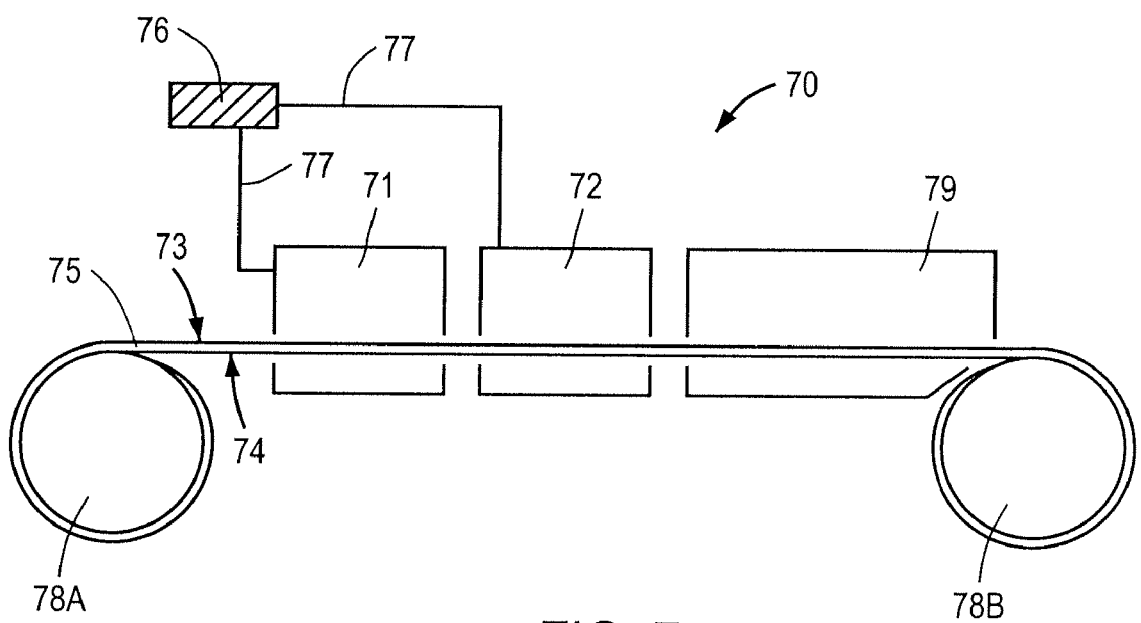
FIG. 7 shows a defect detection and passivation system.

Defect detection and passivation may be carried out on individually cut solar cell structures or they may preferably be carried out in a roll-to-roll manner on a continuous solar cell structure. FIG. 7 shows a roll to roll processing system 70 to detect and passivate defect regions on a workpiece 75 with a top surface 73 and a bottom surface 74. For example, the workpiece 75 may comprise a device structure similar to the solar cell structure 30 shown in FIG. 2. Therefore, the top surface 73 may be the top surface of the TCO film 26 and the bottom surface 74 may be the bottom surface of the substrate 22. The workpiece 75 may be fed by a supply spool 78A and may be rolled back up in a receiving spool 78B after processing. The roll to roll processing system 70 comprises at least one detection station 71 and at least one passivation station 72. As portions of the workpiece 75 travel from the supply spool 78A to the receiving spool 78B either in a continuous motion or in a step-wise motion, they pass through the detection station 71 and the passivation station. Defect regions are detected in the detection station 71, using, for example, the methods described before. A computer 76 is in communication with the detection station 71 and the passivation station 72 through cables 77. The computer 76 may also be in communication with the motion control system (not shown) that controls the motion of the workpiece 75 between the supply spool 78A and the receiving spool 78B. This way the computer 76 gathers the defect location information for a portion of the workpiece measured in the detection station 71 and provides this information to the passivation station 72 so that when that portion of the workpiece is advanced to the passivation station 72, the defect regions identified in the detection station 71 may be passivated. After the passivation of the defect areas, the defect-passivated work piece may be rolled up in the receiving spool 78B and moved to another process station. Preferably, however, the above described detection and passivation processes may be integrated with a grid pattern formation process. In this case, after defect region passivation, the portion of the defect-passivated workpiece moves into a grid application station 79 within which a grid pattern may be deposited and cured on the front surface 73. The grid application station 79 may be a screen printing station, an ink jet writing station and the like, that forms a grid pattern on the defect-passivated portion of the workpiece.

It should be noted that since the solar cell parameters are most negatively impacted by the presence of defects directly under or in close proximity of the grid pattern, defect detection and defect passivation processes may be limited only to these areas. Doing so increases the throughput of the detection and passivation processes compared to the case that carries out such detection and passivation processes over substantially the whole surface of a thin film solar cell structure. In the high throughput process, the location of the grid pattern to be deposited is predetermined and therefore the defect detection and passivation processes are applied to this predetermined location. Considering the fact that grid pattern in a typical solar cell covers only less than 10% of its total area, this approach reduces the area of defect detection and passivation by 90% and increases the throughput of these processes greatly. For example, the roll to roll processing system 70 may be used in this mode to increase its throughput by 10 times or even more. With the increased throughput it becomes feasible to integrate the roll-to-roll defect detection and passivation process with a high speed roll-to-roll finger pattern screen printing process, i.e. carrying out the screen printing step right after the detect passivation step within the same process tool.

Figure 8:
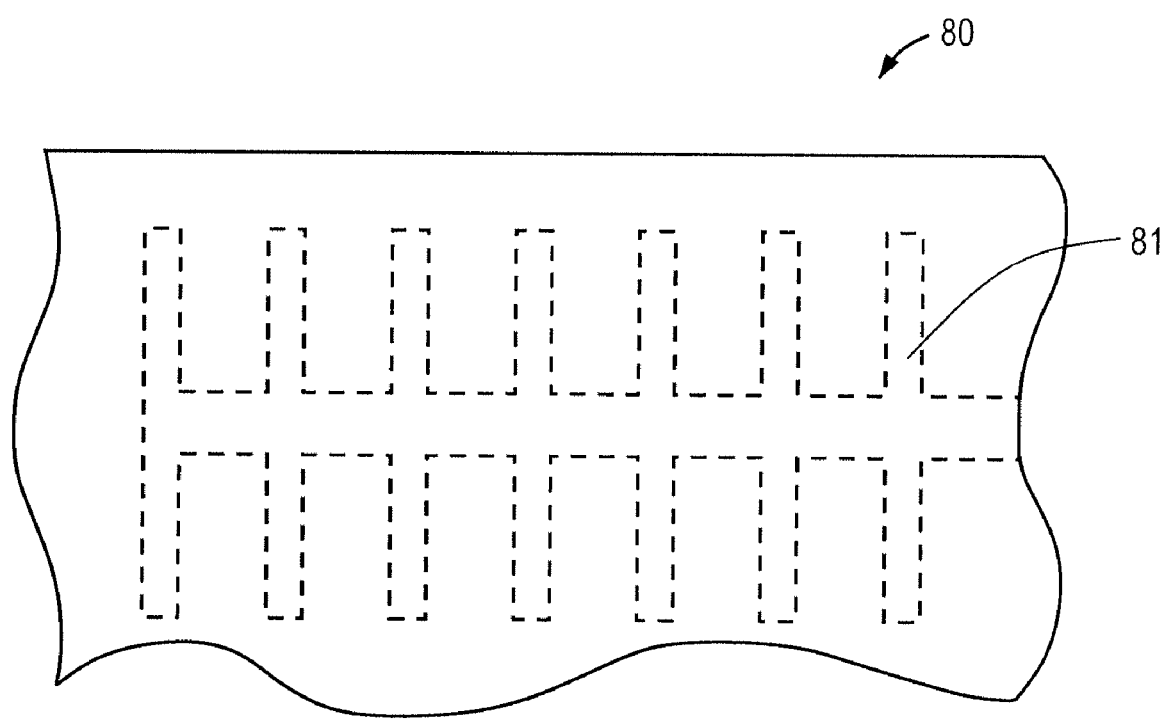
FIG. 8 shows a section of a solar cell structure with a predetermined grid region.

FIG. 8 shows a section 80 of a solar cell structure. The predetermined grid region 81 shown by the dotted lines is a region on the top surface of the section 80 of the solar cell structure, which will receive a grid pattern, such as the grid pattern 41 of FIG. 3, after the step of passivation. The predetermined grid region 81 is substantially the same shape as the grid pattern to be deposited. Preferably, the predetermined grid region 81 is somewhat larger than the grid pattern to assure that when the grid pattern is deposited it falls well within the boundaries defined by the dotted lines in FIG. 8. It is noted that the predetermined grid region 81 is less that 20$, and typically less than 10%, of the surface area for a given section. When the section 80 of the solar cell structure is processed in a defect detection station, the process of detection may be applied just to the predetermined grid region 81 finding and locating the defects only in this region, and due to the grid region 81 area being much less than the area of the entire section, as noted by the percentages above, this can allow for significant benefits. For example, if a laser scanning approach such as LBIC method is used for defect detection, the laser may be scanned only through the predetermined grid region 81 and the positions of the defects identified may be stored by a computer for future use during passivation. Of course, it would also be possible to collect a complete defect data through substantially the whole surface of the section 80 of the solar cell structure but then passivate only the defects falling within the predetermined grid region 81, thus also increasing the throughput of the passivation process. In any case, when the section 80 of the solar cell structure is advanced into a defect passivation process station, defects that fall within the predetermined grid region are passivated by forming high resistivity caps as described before. After defect passivation of the predetermined grid region 81, a grid may be deposited on the predetermined grid region 81. It should be noted that the temporary conductive blankets used for detection of defects in specific regions of a solar cell structure, such as the predetermined grid region 81 of FIG. 8, may be shaped just like that specific region.

The defect region detection methods may be non-contact or contact methods. In non-contact methods, no electrical contact needs to be made to the solar cell structure such as the solar cell structure depicted in FIG. 2. For contact methods, electrical contacts need to be made to the device to carry out a detection procedure. In contact methods one contact is made to the transparent conductive layer (layer 26 in FIG. 2) and the other one to the back contact of the device (layer 23 in FIG. 2).

If the substrate is a conductive foil (see substrate 22 in FIG. 2) then the back contact may be made on the exposed back surface of the substrate itself since the substrate and the device contact layer are electrical shorted. A roll-to-roll system will now be described where both contact and non-contact methods may be applied to a flexible CIGS type solar cell structure (such as the one showed in FIG. 2) for the purpose of detecting various defects in the structure. In this example, the detection station 71 and the passivation station 72 of FIG. 7 are merged together and various different detection method examples are given.

Figure 9A:
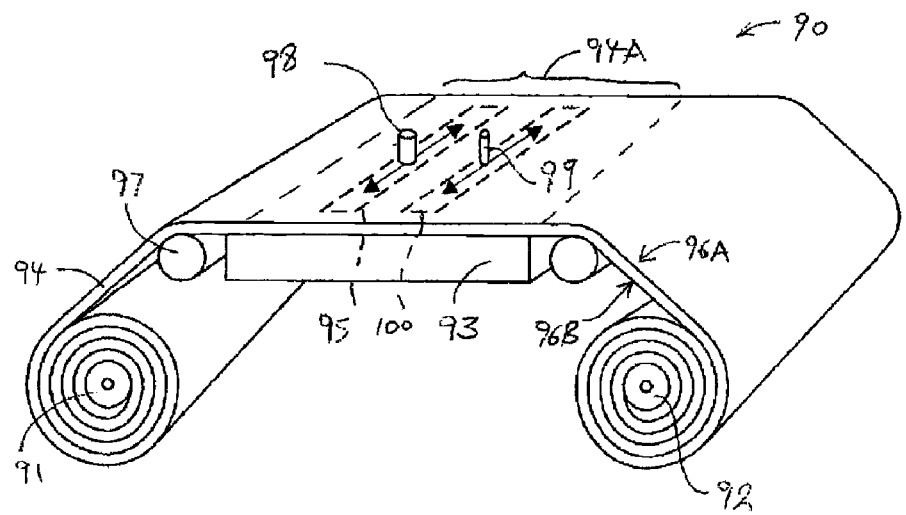
FIG. 9A shows an embodiment of a defect detection tool of the embodiments of the present invention.

A roll-to-roll defect detection and passivation system 90 is shown in FIG. 9A. As shown in FIG. 9A, the system 90 comprises a feeding roller 91, a receiving roller 92, and a process platform 93 disposed between the two rollers. A flexible and continuous workpiece 94 is fed by the feeding roller 91 and passes onto the top surface of the process platform 93 and then is rolled back up on the receiving roller 92 by a moving mechanism (not shown). The workpiece 94 includes a front surface 96A and a back surface 96B. The workpiece 94 may comprise a device structure similar to the solar cell structure 30 shown in FIG. 2. Therefore, the front surface 96A may be the top surface of the TCO film 26 and the back surface 96B may be the back surface of the substrate 22. The top surface of the process platform 93 is substantially flat and may include vacuum holes so that when a section 94A of the workpiece 94 is moved on the top surface of the process platform 93 it can be registered flat onto the top surface by applying vacuum to a portion of the back surface 96B that is on the process platform 93. Once the section 94A of the workpiece 94 is registered flat onto the top surface of the platform, defect detection and/or passivation process may be carried out at least over a predetermined portion of the section 94A, which is indicated as detection area 95 in FIG. 9A. Defect detection process may be carried out using a detector 98 which can move across the front surface of the continuous workpiece over a predetermined detection area 95 when the workpiece is at a detection location.

During the defect detection process an input signal is applied from an input signal source to the predetermined detection area, and an output signal from the predetermined area carrying the defect information is collected by the detector. Exemplary, input signals may be delivered through shining light onto the detection area, applying a voltage between the detection area 95 and the substrate of the workpiece. The output signals may be infra-red (IR) radiation, photoluminescence radiation and electroluminescence radiation and the like, each of which can be operated in DC or AC "lock-in" mode. As sections of the workpiece 94 is advanced from the supply spool 91 to the receiving spool 92 either in a continuous motion or in a step-wise motion, preferably, in a step-wise motion, defect detection is carried out in the detection area 95 and the position information of the detected defects carried by the output signal are recorded by a computer (not shown). This position information is then used to passivate the detected defects in a passivation location. When the detection area 95 moved from the detection location to the passivation location of the system by moving the workpiece 94, it becomes passivation area 100. In essence, both the detection area and the passivation area are the same predetermined area on the front surface of the section of the continuous workpiece in two different locations where the detection and passivation processes can be applied. An injector 99 which may be moved across the front surface 96A of the workpiece 94 over the passivation area 100 goes to the position where the defect has been detected and dispenses a high resistivity ink over the defect region. If the ink is heat-cured or UV-cured type, such curing means may also be applied to the deposited ink (not shown). It should be noted that the detection area 95 and the passivation area 100 may actually be the same area, i.e. both defect detection and passivation may be carried out one after another when the workpiece 94 is kept stationary. However, separating the detection and passivation steps increases throughput. In fact, for higher throughput there may be two or more detection areas with two or more detectors and two or more passivation areas with two or more injectors.

Figure 9B:
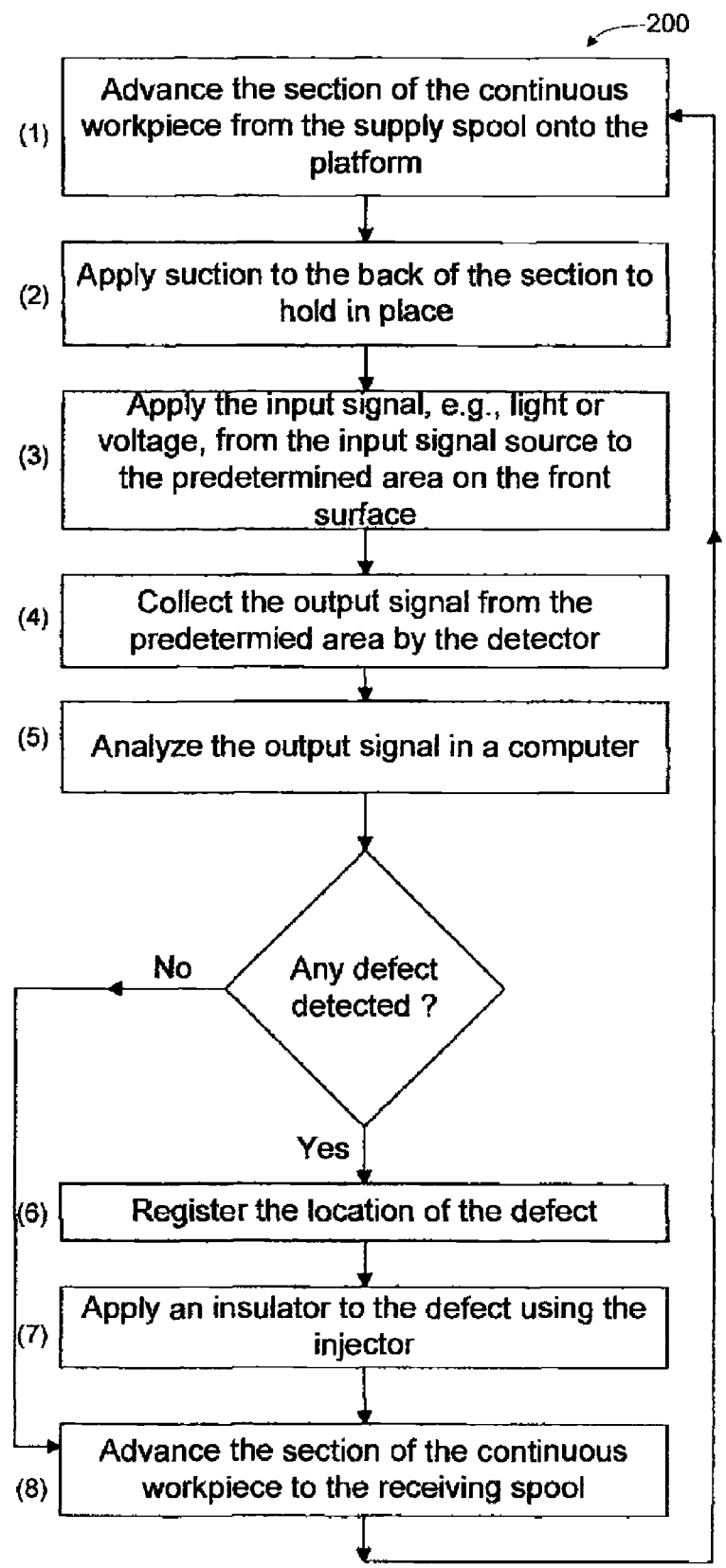
FIG. 9B shows an exemplary process flow using the defect detection tool shown in FIG. 9A.

FIG. 9B shows an embodiment of an exemplary detection process flow 200 using the system shown in FIG. 9A. In step (1), the section 94A of the continuous workpiece 94 is advanced from the supply spool to the surface of the platform 53. In step (2), suction is applied to the back surface of the section 94A so that the section of the continuous workpiece 94 can be made substantially flat and held in place. In step (3), the input signal is applied to a predetermined area on the front surface of the section. The predetermined area may be the area on which a finger pattern will be formed after the detection and passivation process. Alternatively, at this step the signal may be applied to the predetermined area when the predetermined area at a detection location. In step (4), the detector 98 collects the output signal from the predetermined area, and in step (5), this data is analyzed using a computer. If no defect is detected process continues with step (8) in which the section 94A is advanced to the receiving spool, and the process restarts with a following section of the continuous workpiece. If a defect is detected, the process is followed with step (6) in which the position of the defect is registered, i.e., the defect's coordinates in the predetermined area is mapped and recorded in the computer's data base. Next, in step (7), using the position information of the defect, a moving mechanism controlled by the computer drives the injector 99 over the position of the defect to apply an insulating material to the defect. Alternatively, before the step (7), the predetermined area with the defect may be advanced into a passivation location on the platform 53 to apply the injector 99 while another predetermined area is being processed at the detecting location. After the defect is passivated, in step (8), the section is advanced to the receiving spool. It should be noted that the size of the subject defects may vary widely from a few microns up to 1 mm. The insulator dispensed by the injector on a defect region may be as wide as 1-2 mm or even more. It is preferred that the insulator be transparent. In this case, the current loss in the solar cell is minimized even if the insulator size is much larger than the defect size. For example, a 2 mm diameter insulator drop deposited on a 10 micrometer size defect would not cause any current loss due to the presence of insulator over the TCO layer provided that the insulator is substantially transparent to sunlight.

As mentioned before, it is also possible to integrate defect detection and passivation process with a finger pattern deposition step. In this case, the sections of the continuous workpiece that received defect detection and passivation steps may move to a screen printing/curing unit (not shown) of the overall system before the sections are advanced to the receiving spool.

Figure 10:
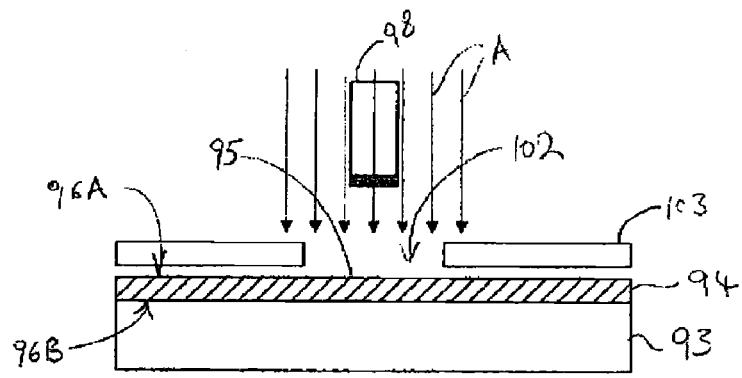
FIGS. 10-11 show various embodiments of the defect detection process and equipment.

It should be noted that the nature of the detector 98 depends on the defect detection method and the input signal source employed. The embodiments of the present invention may use both non-contact detection methods and contact detection methods. The non-contact defect detection methods may utilize techniques such as photoluminescence and infrared thermography. FIG. 10 schematically shows a detection area 95 and sections of the process platform 93 and workpiece 94 under the detection area 95. Both photoluminescence and IR thermography uses illumination, i.e., light photons, as the input signal which is depicted by arrows 'A'. In FIG. 10 the detection area 95 is defined by an opening 102 of a mask 103 placed over the front surface 96A of the workpiece 94. The back surface 96B of the workpiece 94 is on top of the process platform 93. In IR thermography the portion of the solar cell structure of the workpiece 94 within the detection area 95 is illuminated by light coming through the opening 102 of the mask 103 and impinging on the front surface 96A. The impinging light or input signal creates a voltage and a resulting current within the solar cell structure. Light generated current passes through any short circuits in the solar cell structure causing local heating in those locations. The detector 98 in this case is an IR camera which sees and records the heated regions or the short circuits as output signals. It should be noted that this technique can detect short circuits but cannot detect the defects that do not short the TCO layer to the back contact (defect region 27C in FIG. 2).

Another non-contact approach is photoluminescence process. In this case light is shone through the opening 102 of the mask 103 as the input signal and the detector 98 detects photoluminescence coming from the solar cell structure as the output signal. In this case all non-active regions, i.e., regions that do not generate photoluminescence, in the solar cell structure including shorted regions, open circuit regions and regions comprising foreign particles, etc. may be detected. As mentioned before, these techniques can be operated either in a DC or AC mode. In the latter case the excitation source or input source is modulated, and the images are acquired and processed to as to "lock-in" on the signal of interest, with a substantially improved signal to noise ratio. For the specific CIGS solar cell structure the non-contact detection method using photoluminescence is attractive because it avoids surface damage and can detect defects that are shorts as well as defects that may not be shorts but would create shorts when a finger pattern is deposited. It should be noted that the mask 103 may be in the shape of the predetermined grid region 81 of FIG. 8 to carry out detection and passivation only in this grid region.

Figure 11:
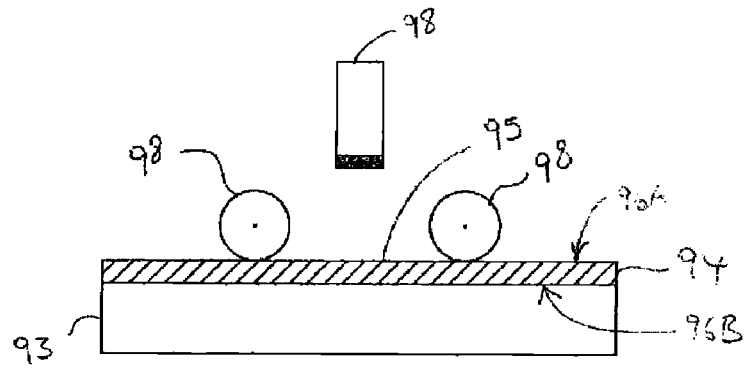

For contact detection methods, electrical contacts need to be made to the top and bottom electrodes of the solar cell structure to provide an input signal. An example is shown in FIG. 11 where the front surface 96A of the workpiece 94 is contacted by highly conductive top contacts 98 and the ohmic contact to the metallic back surface 96B of the workpiece 94 is made by the top surface of the process platform 93, which may be a metallic sheet. As shown in FIG. 11 the top contact 98 may comprise two or more conductive rollers which are placed on the front surface 96A of the workpiece 94. The area between the two conductive rollers 98 defines the detection area 95. The roller surface may also be coated with a conductive rubber material to reduce damage to the TCO surface. Although the contacts shown in FIG. 11 are rollers, other types of electrical contacts such as brushes, etc. may also be used.

Two exemplary detection methods, thermography and electroluminescence may use the conductive rollers to generate input signals. In thermography, a voltage is applied between the rollers and a bottom contact to the back surface 96B of workpiece 94. Short circuiting defect regions in the detection area 95 pass higher current than the rest of the device and therefore get hotter. An IR camera is used as the detector detects the IR radiation from the hot spots as the output signal. As described above, this technique can detect short circuits effectively. However, defects that do not pass high current in the solar cell structure may go undetected. The second exemplary contact method is electroluminescence where a voltage or input signal is applied between the rollers and a bottom contact to the back surface 96B of the workpiece 94 and an electroluminescence detector senses the radiation or the output signal coming from the detection area 95. Shorted areas, open circuited areas as well as areas containing foreign matter may be detected this way as dark, inactive regions of the cell structure. Therefore, electroluminescence detection is preferred for CIGS solar cell structures since it can detect defects that may not be shorts but would create shorts when a finger pattern is deposited.

Although the present inventions are described with respect to certain preferred embodiments, modifications thereto will be apparent to those skilled in the art.

We claim:

1. A method of manufacturing a solar cell, comprising:
providing a continuous flexible solar cell structure, wherein continuous flexible solar cell structure includes a back portion having a substrate and a contact layer and a front portion having an absorber layer and a transparent conductive layer;
advancing a section of the continuous flexible solar cell structure over a flat surface of a platform;
determining a process area on the front portion, the process area being less than 20% of the section of the continuous flexible solar cell structure;
applying an input signal to the process area;
sensing an output signal from the process area by a detector;
processing the output signal sensed by the detector to detect a shunt defect in the front portion in the process area, wherein the step of processing the output signal includes determining the position of the shunt defect that has been detected;
passivating the defect by applying an insulator only onto a localized area of the shunt defect, wherein the step of passivating comprises injecting an insulating ink onto localized area of the shunt defect and curing the insulating ink by one of ultraviolet radiation and heat; and
depositing a conductive grid pattern only within the process area after the step of passivating the shunt defect.

2. The method of claim 1, wherein the step of processing the output signal includes determining the position of the shunt defect that has been detected.

3. The method of claim 1, wherein the input signal induces one of infra-red (IR) radiation, photoluminescence and electroluminescence as the output signal.

4. The method of claim 1, wherein the step of sensing uses as the detector one of an infra-red (IR) detector, a photoluminescence detector and an electroluminescence detector.

5. The method of claim 1, wherein step of applying the input signal comprises applying light to the process area.

6. The method of claim 5, wherein the step of sensing the output signal comprises sensing photoluminescence radiation using a photoluminescence detector.

7. The method of claim 5, wherein the step of sensing the output signal comprises sensing infra-red (IR) radiation using an IR detector.

8. The method of claim 1, wherein step of applying the input signal comprises applying voltage to the process area.

9. The method of claim 8, wherein the step of sensing the output signal comprises sensing infra-red (IR) radiation using an IR detector.

10. The method of claim 8, wherein the step of sensing the output signal comprises sensing electroluminescence radiation using an electroluminescence detector.

11. The method of claim 8, wherein the step of applying voltage comprises applying voltage through at least one of conductive contact rollers or conductive brushes.

12. The method of claim 1 further comprising step of maintaining the section substantially flat over the flat surface of the platform after the step of advancing.

13. The method of claim 1 wherein the insulator applied during the step of passivating is transparent to sunlight.

14. The method of claim 13, wherein the input signal induces one of infra-red (IR) radiation, photoluminescence and electroluminescence as the output signal.

15. The method of claim 14, wherein the step of sensing uses as the detector one of an infra-red (IR) detector, a photoluminescence detector and an electroluminescence detector.

16. The method of claim 1, wherein step of applying the input signal comprises applying light to the process area.

17. The method of claim 16, wherein the step of sensing the output signal comprises sensing infra-red (IR) radiation using an IR detector.

18. The method of claim 1, wherein step of applying the input signal comprises applying voltage to the process area.

19. The method of claim 18, wherein the step of sensing the output signal comprises sensing infra-red (IR) radiation using an IR detector.

20. The method of claim 18, wherein the step of sensing the output signal comprises sensing electroluminescence radiation using an electroluminescence detector.

21. The method of claim 18, wherein the step of applying voltage comprises applying voltage through at least one of conductive contact rollers or conductive brushes.

22. The method of claim 1 further comprising step of maintaining the section substantially flat over the flat surface of the platform after the step of advancing.

23. The method of claim 1 wherein the insulator applied during the step of passivating is transparent to sunlight.

* * * * *